(12) United States Patent
Gad et al.

(10) Patent No.: US 11,996,860 B2
(45) Date of Patent: May 28, 2024

(54) SCALED BIT FLIP THRESHOLDS ACROSS COLUMNS FOR IRREGULAR LOW DENSITY PARITY CHECK DECODING

(71) Applicant: Micron Technology, Inc., Boise, ID (US)

(72) Inventors: Eyal En Gad, Santa Clara, CA (US); Mustafa N. Kaynak, San Diego, CA (US); Sivagnanam Parthasarathy, Carlsbad, CA (US); Yoav Weinberg, Toronto (CA)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/829,924

(22) Filed: Jun. 1, 2022

(65) Prior Publication Data

US 2023/0396269 A1 Dec. 7, 2023

(51) Int. Cl.
*H03M 13/00* (2006.01)
*H03M 13/11* (2006.01)

(52) U.S. Cl.
CPC .... *H03M 13/1108* (2013.01); *H03M 13/1128* (2013.01); *H03M 13/1148* (2013.01); *H03M 13/6511* (2013.01)

(58) Field of Classification Search
CPC ......... H03M 13/1108; H03M 13/1128; H03M 13/1148; H03M 13/6511
See application file for complete search history.

(56) References Cited

U.S. PATENT DOCUMENTS

| | | | |
|---|---|---|---|
| 9,564,931 B1* | 2/2017 | Nguyen | H03M 13/116 |
| 2014/0281785 A1* | 9/2014 | Fainzilber | H03M 13/6583 714/752 |
| 2016/0179620 A1* | 6/2016 | Bazarsky | H03M 13/3707 714/766 |
| 2017/0117925 A1* | 4/2017 | Achtenberg | H03M 13/3746 |
| 2018/0032396 A1* | 2/2018 | Sharon | H03M 13/3738 |
| 2018/0034477 A1* | 2/2018 | Zamir | H03M 13/1105 |
| 2018/0219561 A1* | 8/2018 | Litsyn | H03M 13/2915 |
| 2020/0091933 A1* | 3/2020 | Tate | H03M 13/2906 |

\* cited by examiner

*Primary Examiner* — Esaw T Abraham
(74) *Attorney, Agent, or Firm* — Lowenstein Sandler LLP

(57) ABSTRACT

A processing device in a memory sub-system reads a sense word from a memory device and executes a plurality of parity check equations on corresponding subsets of the sense word to determine a plurality of parity check equation results. The processing device further determines a syndrome for the sense word using the plurality of parity check equation results and determines whether the syndrome for the sense word satisfies a codeword criterion. Responsive to the syndrome for the sense word not satisfying the codeword criterion, the processing device performs an iterative low density parity check (LDPC) correction process using a scaled bit flip threshold to correct one or more errors in the sense word.

20 Claims, 6 Drawing Sheets

FIG. 3

| | SWB0 | SWB1 | SWB2 | SWB3 | SWB4 | SWB5 | SWB6 | SWB7 | |
|---|---|---|---|---|---|---|---|---|---|
| | 1 | 0 | 1 | 1 | 0 | 0 | 1 | 0 | SENSE WORD 310 |
| SB0 | 1 | 1 | 1 | 0 | 1 | 0 | 0 | 0 | 0 ← SYNDROME 320 |
| SB1 | 1 | 1 | 1 | 0 | 0 | 1 | 0 | 0 | 0 |
| SB2 | 1 | 1 | 1 | 0 | 0 | 0 | 1 | 1 | 1 |
| SB3 | 1 | 0 | 0 | 1 | 0 | 0 | 0 | 0 | 1 |
| SB4 | 1 | 1 | 0 | 1 | 0 | 1 | 1 | 1 | 1 |
| SB5 | 1 | 0 | 1 | 0 | 1 | 1 | 1 | 0 | 0 |
| SB6 | 1 | 1 | 0 | 1 | 0 | 0 | 0 | 0 | 0 |
| SB7 | 1 | 1 | 0 | 1 | 0 | 1 | 1 | 1 | 1 |

300

US 11,996,860 B2

SCALED BIT FLIP THRESHOLDS ACROSS COLUMNS FOR IRREGULAR LOW DENSITY PARITY CHECK DECODING

TECHNICAL FIELD

Embodiments of the disclosure relate generally to memory sub-systems, and more specifically, relate to scaled bit flip thresholds across columns for irregular low density parity check decoding in a memory sub-system.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

FIG. 3 is a diagram illustrating a sense word-syndrome matrix used for configuring iterative error correction parameters in accordance with some embodiments of the present disclosure.

DETAILED DESCRIPTION

Figure 1A:
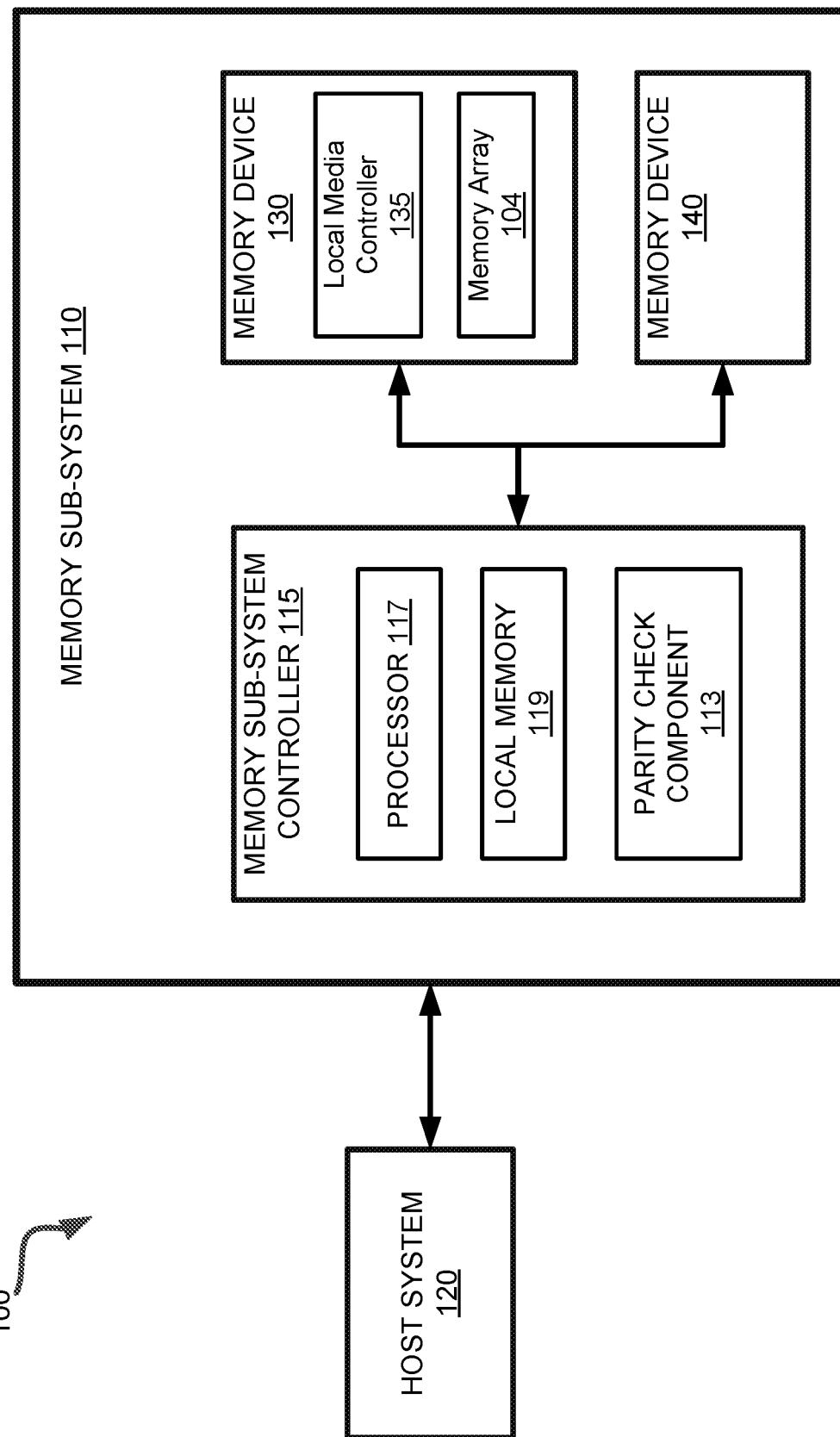
FIG. 1A illustrates an example computing system that includes a memory sub-system in accordance with some embodiments of the present disclosure.

Aspects of the present disclosure are directed to scaled bit flip thresholds across columns for irregular low density parity check decoding in a memory sub-system. A memory sub-system can be a storage device, a memory module, or a hybrid of a storage device and memory module. Examples of storage devices and memory modules are described below in conjunction with FIG. 1A. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. For example, NAND memory, such as 3D flash NAND memory, offers storage in the form of compact, high density configurations. A non-volatile memory device is a package of one or more dice, each including one or more planes. For some types of non-volatile memory devices (e.g., NAND memory), each plane includes of a set of physical blocks. Each block includes of a set of pages. Each page includes of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

A memory device can be made up of bits arranged in a two-dimensional or a three-dimensional grid. Memory cells are formed onto a silicon wafer in an array of columns (also hereinafter referred to as bitlines) and rows (also hereinafter referred to as wordlines). A wordline can refer to one or more rows of memory cells of a memory device that are used with one or more bitlines to generate the address of each of the memory cells. The intersection of a bitline and wordline constitutes the address of the memory cell. A block hereinafter refers to a unit of the memory device used to store data and can include a group of memory cells, a wordline group, a wordline, or individual memory cells. One or more blocks can be grouped together to form separate partitions (e.g., planes) of the memory device in order to allow concurrent operations to take place on each plane.

One example of a memory sub-system is a solid-state drive (SSD) that includes one or more non-volatile memory devices and a memory sub-system controller to manage the non-volatile memory devices. The memory sub-system controller can encode data into a format for storage at the memory device(s). For example, a class of error detection and correcting codes (ECC), such as low density parity check (LDPC) codes, can be used to encode the data. LDPC codes are capacity-approaching codes, which means that practical constructions exist which allow the error threshold to be set very close to a theoretical maximum. This error threshold defines an upper bound for errors in the data, up to which the probability of lost information can be made as small as desired. LDPC codes are reliable and highly efficient, making them useful in bandwidth-constrained applications. For example, encoded data written to physical memory cells of a memory device can be referred to as a codeword. The data read from the cells, which might include errors and differ from the codeword, can be referred to as a sense word. The sense word can include one or more of user data, error correcting code, metadata, or other information.

In performing error correcting code operations, including, as part of a read operation, encoded data stored on the memory device can be transmitted from the memory device to the memory sub-system controller. The memory sub-system controller can perform decoding operations to decode the encoded data into the original sequence of bits that were encoded for storage on the memory device. A number of bits of the decoded data received by the memory sub-system controller may have been flipped due to noise, interference, distortion, bit synchronization errors, or errors from the media itself (both intrinsic and extrinsic). For example, a bit that may have originally been stored as a 0 may be flipped to a 1 or vice versa.

Many memory sub-systems perform error correcting code operations to attempt to correct bit flip errors in a sense word read from the memory device. For example, a memory sub-system can perform error correcting code operations on stored data to detect and correct errors in the encoded data. In many cases, the data is decoded using an iterative process.

Segments of a data array can be decoded to produce a corresponding string of bits (e.g., a sense word).

Generally, error correction in a memory sub-system is a time and resource intensive process. The error correction process utilizes a number of parity check equations, each applicable to a subset of the bits of the sense word, which function together to identify bit flip errors in the sense word. In certain implementations, each bit of the sense word has the same number of associated parity check equations. Such implementations can be referred to as "regular" LDPC decoding. In each iteration of such an error correction process, the memory sub-system controller can identify the energy associated with each bit of the sense word and identify a maximum energy associated with any one bit of the sense word. In one embodiment, the energy (also referred to herein as the energy level) associated with a given bit can be represented by a number of unsatisfied parity check equations associated with the bit. In another embodiment, the energy can be the number of unsatisfied parity check equations plus the XOR of the current bit value with its original value. The memory sub-system controller can compare the energy for each bit to the identified maximum energy, flip those bits that have an energy that match the maximum energy, and move on to a next iteration of the process. This is effective when each bit of the sense word has the same number of associated parity check equations, since the maximum energy is easily determined. In other implementations, however, different bits of the sense word can have different numbers of associated parity check equations. Such implementations can be referred to as "irregular" LDPC decoding. When there are variances in the number of parity check equations associated with each bit, simply using the maximum energy associated with any one bit as a threshold for identifying which bits of the sense word to flip can lead to decreased decoding performance and sub-optimal error correction capability in the memory sub-system.

Aspects of the present disclosure address the above and other deficiencies by implementing scaled bit flip thresholds across columns for irregular low density parity check decoding in a memory sub-system. In one embodiment, a parity check component of a memory sub-system controller reads a sense word from a memory device of the memory sub-system and executes a number of parity check equations on corresponding subsets of the sense word. In one embodiment, each of the parity check equations corresponds to a different subset of the bits of the sense word, although different subsets can share one or more bits, and each bit can potentially be associated with a different number of parity check equations. For example, at least two bits in the sense word can be associated with different numbers of parity check equations. Each parity check equation generates a parity check equation result which indicates whether a number of bits set to a value of '1' in the corresponding subset of the sense word is even or odd. In one embodiment, if the number of bits set to a value of '1' in the corresponding subset is even, the parity check equation result is said to be in a satisfied state (i.e., a state indicating that there are no errors in the corresponding subset of the sense word) and if the number of bits set to a value of '1' in the corresponding subset is odd, the parity check equation result is said to be in an unsatisfied state (i.e., a state indicating that there are errors in the corresponding subset of the sense word). Since any one bit of the sense word can be part of multiple different subsets, that bit can contribute to or be associated with multiple parity check equation results. In one embodiment, the parity check component logically combines all of the parity check equation results to determine a syndrome for the sense word. If the syndrome for the sense word does not satisfy a codeword criterion (e.g., does not indicate that all of the parity check equation results are in a satisfied state), the parity check component determines that there are one or more errors in the sense word and initiates an iterative LDPC correction process.

Once the parity check component begins flipping bits in the sense word, the sequence of bits can be referred to as a corrected word. In one embodiment, each iteration of the LDPC correction process uses some criterion to identify which bits of the corrected word to flip (i.e., to change from a '1' to a '0' or vice versa). In one embodiment, the criterion can include, for example, a maximum energy for any one bit of the corrected word from the previous iteration (i.e., the iteration performed immediately before a current iteration), but scaled to account for the differences in the number of parity check equations associated with each bit. In one embodiment, the parity check component can normalize the energy levels of each bit from the previous iteration before the maximum is identified. For example, the energy (i.e., the number of unsatisfied parity check equations associated with the bit) can be calculated as a percentage or fraction of a total number of parity check equations associated with the bit, and the highest percentage or fraction associated with any one bit can be used as the bit flipping criterion. Thus, in the current iteration, the parity check component can flip those bits that satisfy the bit flipping criterion (i.e., those bits for which the percentage or fraction is greater than or equal to the maximum fraction or percentage from the previous iteration). The parity check component can perform multiple iterations of the LDPC correction process until the syndrome for the corrected word satisfies the codeword criterion, or until a threshold number of iterations is reached.

Advantages of the approach described herein include, but are not limited to, improved performance in the memory sub-system. For example, by scaling bit flip thresholds across columns in irregular LDPC decoding, both time and energy savings can be realized during the decoding operations. The LDPC decoder can thus correct more errors in less time than unscaled approaches, which results in improved decoding performance. This also reduces the time and complexity of the parity check and error correction processes, thereby freeing resources of the memory sub-system controller to perform other operations.

FIG. 1A illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., one or more memory device(s) 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1A illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access the memory components (e.g., the one or more memory device(s) 130) when the memory sub-system 110 is coupled with the host system 120 by the PCIe interface. The physical host interface can provide an interface for passing control, address, data, and other signals between the memory sub-system 110 and the host system 120. FIG. 1A illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device(s) 130) include negative-and (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory device(s) 130 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, electrically erasable programmable read-only memory (EEPROM).

A memory sub-system controller 115 (or controller 115 for simplicity) can communicate with the memory device(s) 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., a processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1A has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory device(s) 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory device(s) 130. The memory sub-system controller 115 can further include host interface circuitry to communicate with the host system 120 via the physical host interface. The host interface circuitry can convert the commands received from the host system into command instructions to access the memory device(s) 130 as well as convert responses associated with the memory device(s) 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory device(s) 130.

In some embodiments, the memory device(s) 130 include local media controllers 135 that operate in conjunction with memory sub-system controller 115 to execute operations on one or more memory cells of the memory device(s) 130. An external controller (e.g., memory sub-system controller 115) can externally manage the memory device 130 (e.g., perform media management operations on the memory device(s) 130). In some embodiments, a memory device 130 is a managed memory device, which is a raw memory device (e.g., memory array 104) having control logic (e.g., local controller 135) for media management within the same memory device package. An example of a managed memory device is a managed NAND (MNAND) device. Memory device(s) 130, for example, can each represent a single die having some control logic (e.g., local media controller 135) embodied thereon. In some embodiments, one or more components of memory sub-system 110 can be omitted.

In one embodiment, the memory sub-system 110 includes a parity check component 113 that can implement scaled bit flip thresholds across columns in irregular low-density parity check (LDPC) decoding operations to identify and correct errors in data stored on memory device 130. In one embodiment, responsive to the syndrome for a sense word read from memory device 130 not satisfying the codeword criterion (e.g., one or more of the parity check equation results being in an unsatisfied state), parity check component 113 can perform an iterative LDPC correction process. In one embodiment, parity check component 113 determines a number of parity check equation results that are in an unsatisfied state for each bit of the sense word and determines a maximum number of parity check equation results that are in the unsatisfied state for any one bit of the sense word. In one embodiment, parity check component 113 can normalize the energy levels of each bit from the previous iteration before the maximum is identified to account for differences in the total number of parity check equations associated with each bit of the sense word. Parity check component 113 can flip any bits in the sense word having a level of energy (e.g., a threshold number of parity check equation results that are in the unsatisfied state) that satisfies an energy threshold condition (e.g., is greater than or equal to a threshold level of energy), and flip each of the parity check equation results associated with those bits. In one embodiment, the threshold level of energy is equal to the maximum energy (e.g., the maximum number of parity check equation results that are in the unsatisfied state) for any one bit of the sense word from the current or a previous iteration and normalized according to the total number of associated parity check equations). Parity check component 113 further determines whether a number of iterations performed in the iterative LDPC correction process satisfies an iteration criterion (e.g., is less than a threshold number of iterations), and if so continues the LDPC correction process by moving on to a next iteration. In response to the number of iterations performed not satisfying the iteration criterion (e.g., meeting or exceeding the threshold number of iterations), parity check component 113 can end the LDPC correction process. Further details with regards to the operations of parity check component 113 are described below.

Figure 1B:
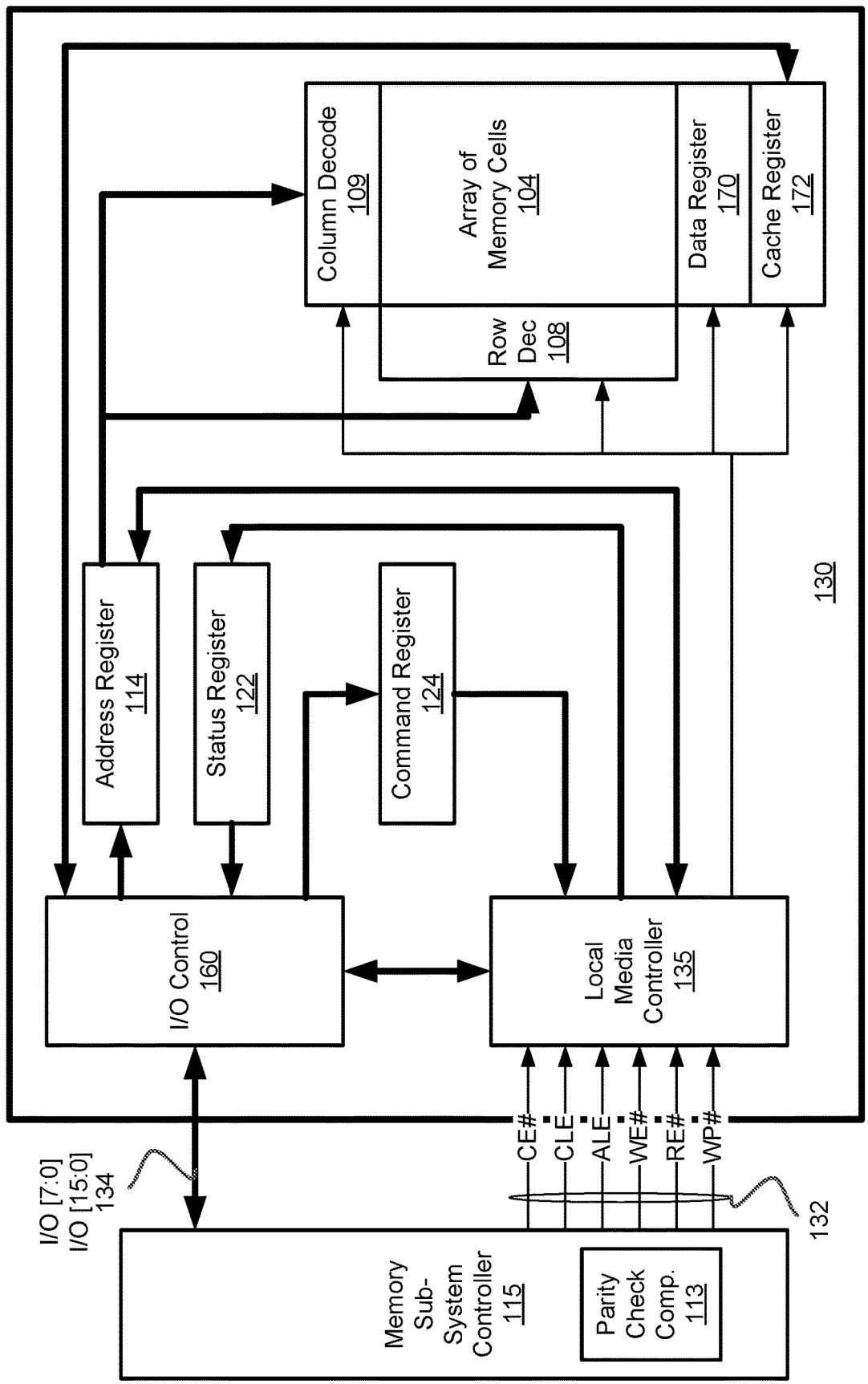
FIG. 1B is a block diagram of memory device(s) in communication with a memory sub-system controller of a memory sub-system, in accordance with some embodiments of the present disclosure.

FIG. 1B is a simplified block diagram of a first apparatus, in the form of a memory device 130, in communication with a second apparatus, in the form of a memory sub-system controller 115 of a memory sub-system (e.g., memory sub-system 110 of FIG. 1A), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130), may be a memory controller or other external host device.

Memory device 130 includes an array of memory cells 104 logically arranged in rows and columns. Memory cells of a logical row are typically connected to the same access line (e.g., a wordline) while memory cells of a logical column are typically selectively connected to the same data line (e.g., a bit line). A single access line may be associated with more than one logical row of memory cells and a single data line may be associated with more than one logical column. Memory cells (not shown in FIG. 1B) of at least a portion of array of memory cells 104 are capable of being programmed to one of at least two target data states.

Row decode circuitry 108 and column decode circuitry 109 are provided to decode address signals. Address signals are received and decoded to access the array of memory cells 104. Memory device 130 also includes input/output (I/O) control circuitry 160 to manage input of commands, addresses and data to the memory device 130 as well as output of data and status information from the memory device 130. An address register 114 is in communication with I/O control circuitry 160 and row decode circuitry 108 and column decode circuitry 109 to latch the address signals prior to decoding. A command register 124 is in communication with I/O control circuitry 160 and local media controller 135 to latch incoming commands.

A controller (e.g., the local media controller 135 internal to the memory device 130) controls access to the array of memory cells 104 in response to the commands and generates status information for the external memory sub-system controller 115, i.e., the local media controller 135 is configured to perform access operations (e.g., read operations, programming operations and/or erase operations) on the array of memory cells 104. The local media controller 135 is in communication with row decode circuitry 108 and column decode circuitry 109 to control the row decode circuitry 108 and column decode circuitry 109 in response to the addresses.

The local media controller 135 is also in communication with a cache register 172. Cache register 172 latches data, either incoming or outgoing, as directed by the local media controller 135 to temporarily store data while the array of memory cells 104 is busy writing or reading, respectively, other data. During a program operation (e.g., write operation), data may be passed from the cache register 172 to the data register 170 for transfer to the array of memory cells 104; then new data may be latched in the cache register 172 from the I/O control circuitry 160. During a read operation, data may be passed from the cache register 172 to the I/O control circuitry 160 for output to the memory sub-system controller 115; then new data may be passed from the data register 170 to the cache register 172. The cache register 172 and/or the data register 170 may form (e.g., may form a portion of) a page buffer of the memory device 130. A page buffer may further include sensing devices (not shown in FIG. 1B) to sense a data state of a memory cell of the array of memory cells 104, e.g., by sensing a state of a data line connected to that memory cell. A status register 122 may be in communication with I/O control circuitry 160 and the local memory controller 135 to latch the status information for output to the memory sub-system controller 115.

Memory device 130 receives control signals at the memory sub-system controller 115 from the local media controller 135 over a control link 132. For example, the control signals can include a chip enable signal CE #, a command latch enable signal CLE, an address latch enable signal ALE, a write enable signal WE #, a read enable signal RE #, and a write protect signal WP #. Additional or alternative control signals (not shown) may be further received over control link 132 depending upon the nature of the memory device 130. In one embodiment, memory device 130 receives command signals (which represent commands), address signals (which represent addresses), and data signals (which represent data) from the memory sub-system controller 115 over a multiplexed input/output (I/O) bus 236 and outputs data to the memory sub-system controller 115 over I/O bus 236.

For example, the commands may be received over input/output (I/O) pins [7:0] of I/O bus 236 at I/O control circuitry 160 and may then be written into command register 124. The addresses may be received over input/output (I/O) pins [7:0] of I/O bus 236 at I/O control circuitry 160 and may then be written into address register 114. The data may be received over input/output (I/O) pins [7:0] for an 8-bit device or input/output (I/O) pins [15:0] for a 16-bit device at I/O control circuitry 160 and then may be written into cache register 172. The data may be subsequently written into data register 170 for programming the array of memory cells 104.

In an embodiment, cache register 172 may be omitted, and the data may be written directly into data register 170. Data may also be output over input/output (I/O) pins [7:0] for an 8-bit device or input/output (I/O) pins [15:0] for a 16-bit device. Although reference may be made to I/O pins, they may include any conductive node providing for electrical connection to the memory device 130 by an external device (e.g., the memory sub-system controller 115), such as conductive pads or conductive bumps as are commonly used.

It will be appreciated by those skilled in the art that additional circuitry and signals can be provided, and that the memory device 130 of FIG. 1B has been simplified. It should be recognized that the functionality of the various block components described with reference to FIG. 1B may not necessarily be segregated to distinct components or component portions of an integrated circuit device. For example, a single component or component portion of an integrated circuit device could be adapted to perform the functionality of more than one block component of FIG. 1B. Alternatively, one or more components or component portions of an integrated circuit device could be combined to perform the functionality of a single block component of FIG. 1B. Additionally, while specific I/O pins are described in accordance with popular conventions for receipt and output of the various signals, it is noted that other combinations or numbers of I/O pins (or other I/O node structures) may be used in the various embodiments.

Figure 2:
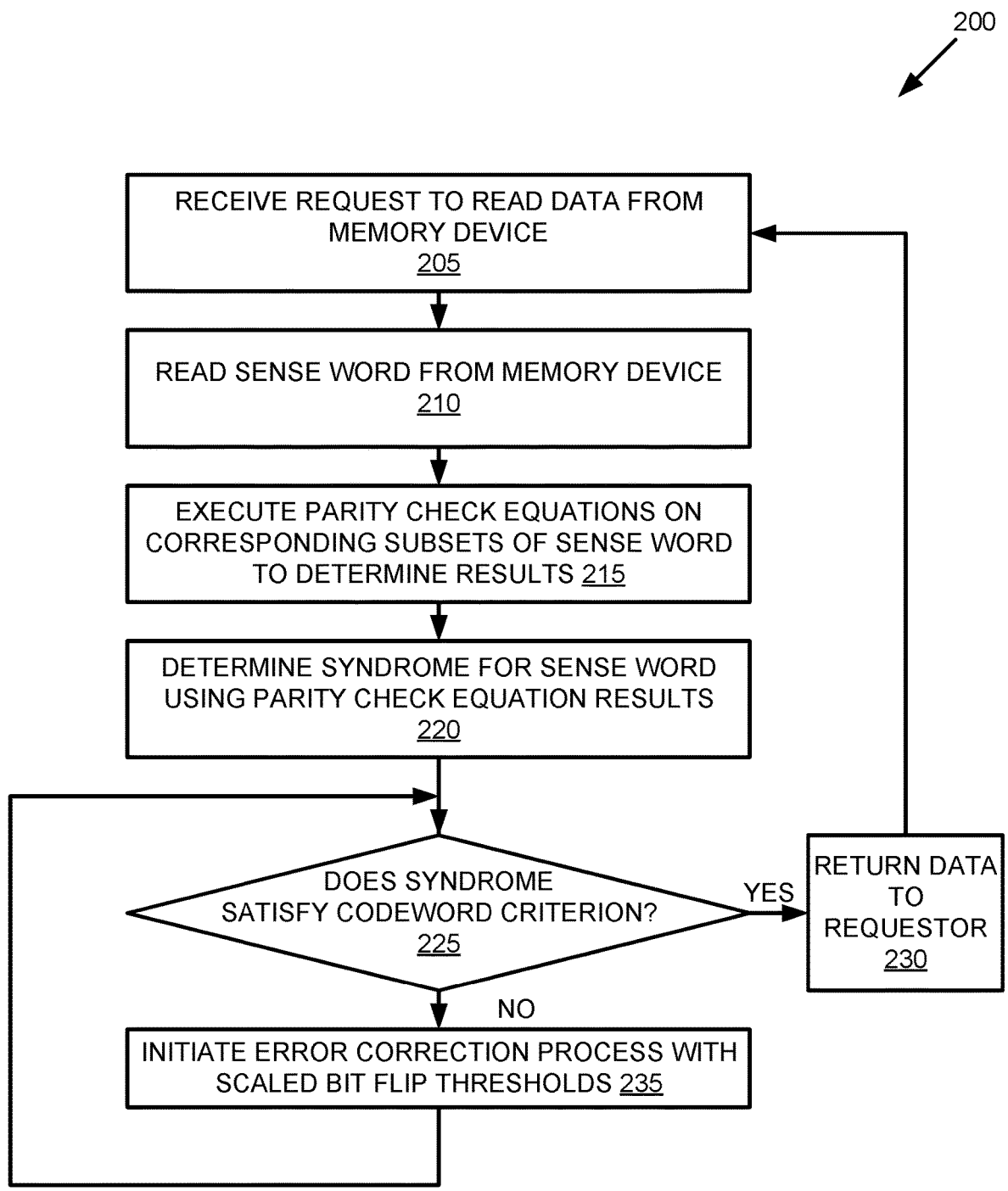
FIG. 2 is a flow diagram of an example method of initiating error correction operations in a memory sub-system in accordance with some embodiments of the present disclosure.

FIG. 2 is a flow diagram of an example method of initiating error correction operations in a memory sub-system in accordance with some embodiments of the present disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by parity check component 113 of FIG. 1A. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 205, a request is received. For example, the processing logic (e.g., parity check component) receives, from a requestor, a request to read data from a memory device, such as memory device 130. In one embodiment, memory sub-system controller 115 receives the request from host system 120 or from some other component connected to or within memory sub-system 110. The request may identify data to be read from memory device 130 of memory sub-system 110.

At operation 210, data is read. For example, the processing logic reads a sense word from the memory device 130. In one embodiment, the sense word includes a sequence of bits representing the data requested at operation 205. In one embodiment, parity check component 113 identifies a physical address in memory device 130 where the requested data is stored, reads the sense word from memory device 130, and temporarily stores the sense word in a buffer or other storage location while parity check and/or error correction processes can be performed. An example sense word 310 is shown in FIG. 3. Sense word 310 is illustrated as including a sequence of eight sense word bits (i.e., SWB0-SWB7), although it should be understood that this is merely an example used for illustrative purposes. In other embodiments, the sense word can include any number of bits, such as several thousand bits (e.g., $36k$ bits).

At operation 215, one or more equations are executed. For example, the processing logic executes a number of parity check equations on corresponding subsets of the sense word. In one embodiment, each of the parity check equations corresponds to a different subset of the bits of the sense word, although different subsets can share one or more bits. For example, in one embodiment, a subset can include 40 bits out of the $36k$ bits in the sense word. There could be, for example, several thousand (e.g., $3k$) parity check equations each configured to operate on a different subset of 40 bits. In one embodiment, the number of parity check equations associated with one or more bits of the sense word can be different than the number of parity check equations associated with other bits. For example, if one bit of the sense word has five associated parity check equations, another bit of the sense word could have eight associated parity check equations. Each parity check equation generates a parity check equation result which indicates whether a number of bits set to a value of '1' in the corresponding subset of the sense word is even or odd. In one embodiment, if the number of bits set to a value of '1' in the corresponding subset is even, the parity check equation result is said to be in a satisfied state and if the number of bits set to a value of '1' in the corresponding subset is odd, the parity check equation result is said to be in an unsatisfied state. In another embodiment, these values (i.e., logic states) can be reversed. Since any one bit of the sense word can be part of multiple different subsets, that bit can contribute to or be associated with multiple parity check equation results. In one embodiment, each bit of the sense word is part of the same number of subsets used by the parity check equations (e.g., 4 subsets). In another embodiment, one or more bits of the sense word are part of a different number of subsets.

At operation 220, a syndrome is determined. For example, the processing logic determines a syndrome for the sense word using the determined parity check equation results. In one embodiment, parity check component 113 logically combines the parity check equation results to determine the syndrome, such as by appending or concatenating the parity check equation results. An example syndrome 320 is shown in FIG. 3. Syndrome 320 is illustrated as including a sequence of eight syndrome bits (i.e., SB0-SB7), although it should be understood that this is merely an example used for illustrative purposes. In other embodiments, the syndrome can include any number of bits, such as several thousand bits (e.g., 3 k bits).

FIG. 3 is a block diagram illustrating a sense word-syndrome matrix 300 used for configuring iterative error correction parameters in accordance with some embodiments of the present disclosure. As described above, sense word 310 includes a number of bits read from a memory device and syndrome 320 includes a number of bits representing parity check equation results. In the illustrated example, there are eight parity check equations each corresponding to a different subset of the bits of sense word 310. For example, a first subset represented by SB0 includes SWB0, SWB1, SWB2, and SWB4. A second subset represented by SB1 includes SWB0, SWB1, SWB2, and SWB5. A third subset represented by SB2 includes SWB0, SWB1, SWB2, and SWB6. There are additional subsets represented by each bit of syndrome 320. In the matrix 300, a value of '1' can indicate that a given bit of sense word 310 is part of a subset represented by a bit of syndrome 320, while a value of '0' can indicate that the bit of sense word 310 is not a part of the subset.

In one embodiment, the parity check equations each identify the logical state of the bits of sense word 310 that are part of each corresponding subset, sums those bits together and determines whether the result is even or odd. In other words, each parity check equation determines whether the number of bits of the sense word 310 that are part of a corresponding subset and have a certain logical state is even or odd. For example, parity check component 113 can determine whether a number of bits set to a logical value of '1' in a corresponding subset of the sense word 310 is even or odd. In one embodiment, if the number of bits set to a logical value of '1' in a corresponding subset of the sense word 310 is even, the parity check equation result can be '0' indicating that the parity check equation is satisfied. If the number of bits set to a logical value of '1' in a corresponding subset of the sense word 310 is odd, the parity check equation result can be '1' indicating that the parity check equation is unsatisfied. Each bit of syndrome 320 represents one of these parity check equation results. Thus, for SB0, since SWB0 is set to a value '1', SWB1 is set to a value of '0', SWB2 is set to a value of '1', and SWB4 is set to a value of '0', there are two bits of sense word 310 in the corresponding subset that are set to a value of '1'. Two bits is even, so the parity check equation result represented by SB0 is '0' indicating that the corresponding parity check equation is satisfied. For SB2, for example, since SWB0 is set to a value '1', SWB1 is set to a value of '1', SWB2 is set to a value of '1', and SWB6 is set to a value of '1', there are three bits of sense word 310 in the corresponding subset that are set to a value of '1'. Three bits is odd, so the parity check equation result represented by SB2 is '1' indicating that the corresponding parity check equation is unsatisfied.

As illustrated in FIG. 3, the number of parity check equations associated with each bit of sense word 310 are not the same. In other words, there are certain bits of sense word 310 that are associated with different numbers of parity check equations. For example, SWB0 is associated with eight different parity check equations represented by SB0-SB7. SWB1 is associated with six different parity check equations represented by SB0, SB1, SB2, SB4, SB6, and SB7. SWB2 is associated with four different parity check equations represented by SB0, SB1, SB2, and SB5. SWB3 is associated with four different parity check equations represented by SB3, SB4, SB6, and SB7. SWB4 is associated with two different parity check equations represented by SB0 and SB5. SWB5 is associated with four different parity check equations represented by SB1, SB4, SB5, and SB7. SWB6 is associated with four different parity check equations represented by SB2, SB3, SB4, and SB7. SWB7 is associated with four different parity check equations represented by SB1, SB3, SB6, and SB7.

Referring again to FIG. 2, at operation 225, a determination is made. For example, the processing logic determines whether the syndrome for the sense word satisfies a codeword criterion. In one embodiment, parity check component 113 determines whether all of the parity check equation results in the syndrome are in a satisfied state (e.g., have a value of '0'). In one embodiment, if all of the parity check equation results in the syndrome are in a satisfied state, parity check component 113 determines that the syndrome satisfies the codeword criterion. Conversely, if all of the parity check equation results in the syndrome are not in a satisfied state (e.g., one or more have a value of '1'), parity check component 113 determines that the syndrome does not satisfy the codeword criterion. If the syndrome for the sense word does satisfy the codeword criterion, parity check component 113 determines that there are no errors in the sense word and, at operation 230, returns the sense word to the requestor as the requested data.

If, however, the syndrome for the sense word does not satisfy the codeword criterion, the parity check component 113 determines that there are one or more errors in the sense word and, at operation 235, initiates an iterative LDPC bit flip decoding process using scaled bit flip thresholds. In one embodiment, each iteration uses a criterion to determine which bits of the corrected word to flip (i.e., to change from a '1' to a '0' or vice versa) and can include, for example, a maximum number of parity check equation results that are in the unsatisfied state for any one bit of the corrected word from the previous full iteration (i.e., the iteration performed immediately before a current iteration) and normalized to account for the differences in the number of parity check equations associated with each bit. Parity check component 113 can perform multiple iterations of the LDPC correction process until the syndrome for the corrected word satisfies the codeword criterion at operation 225, or until a threshold number of iterations is reached. Additional details of the iterative LDPC correction process are described below with respect to FIG. 4.

Figure 4:
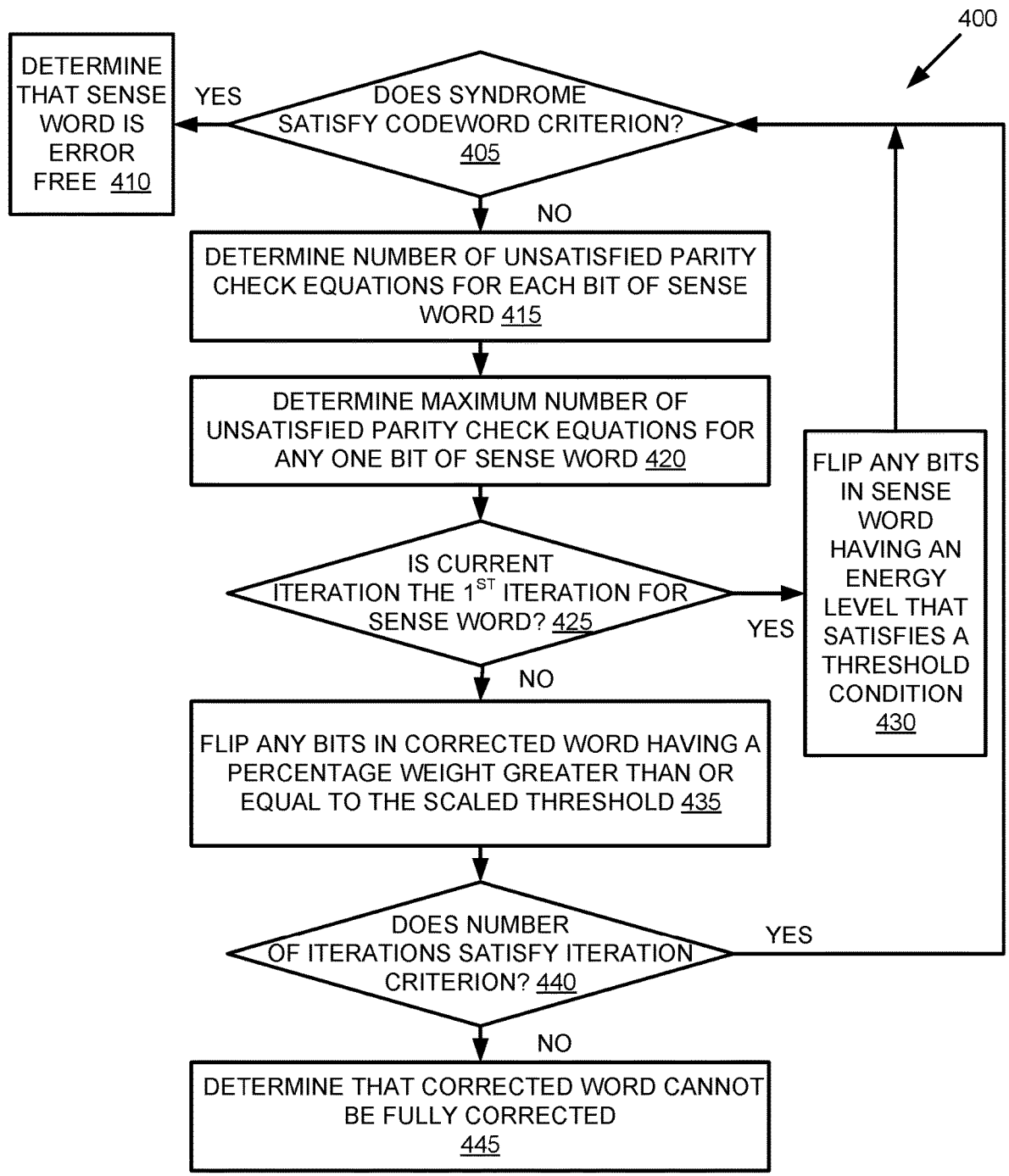
FIG. 4 is a flow diagram of an example method of an iterative error correction process using scaled bit flip thresholds across columns for irregular low density parity check decoding in accordance with some embodiments of the present disclosure.

FIG. 4 is a flow diagram of an example method of an iterative error correction process using scaled bit flip thresholds across columns for irregular low density parity check decoding in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by parity check component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 405, the processing logic determines whether the syndrome for a sense word satisfies codeword criterion. If the syndrome for the sense word does satisfy the codeword criterion (i.e., if all of the parity check equation results in the syndrome are in a satisfied state (e.g., have a value of '0')), at operation 410, the processing logic determines that there are no errors in the sense word. If, however, the syndrome for the sense word does not satisfy the codeword criterion (i.e., all of the parity check equation results in the syndrome are not in a satisfied state (e.g., one or more have a value of '1')), the parity check component 113 determines that there are one or more errors in the sense word and initiates an iterative LDPC correction process. The iterative LDPC correction process can include a number of iterations, beginning with a first iteration and continuing to one or more subsequent iterations.

At operation 415, the processing logic determines a number of parity check equations results that are in an unsatisfied state for each bit of the sense word. Using the example above and illustrated in FIG. 3, SWB0 of sense word 310 is part of the subsets corresponding to SB0-SB7 of syndrome 320, SWB1 of sense word 310 is part of the subsets corresponding to SB0, SB1, SB2, SB4, SB6, and SB7 of syndrome 320, and SWB7 of sense word 310 is part of the subsets corresponding to SB1, SB3, SB6, and SB7 of syndrome 320. The additional bits of sense word 310 are part of different subsets represented by each bit of syndrome 320. For SWB0, since SB0 is set to a value of '0', SB1 is set to a value of '0', SB2 is set to a value of '1', SB3 is set to a value of '1', SB4 is set to a value of '1', SB5 is set to a value of '0', SB6 is set to a value of '0', and SB7 is set to a value of '1', there are four bits of syndrome 320 that are set to a value of '1' indicating corresponding parity check equation results in the unsatisfied state (i.e., the energy of SWB0 is four). For SWB1, since SB0 is set to a value of '0', SB1 is set to a value of '0', SB2 is set to a value of '1', SB4 is set to a value of '1', SB6 is set to a value of '0', and SB7 is set to a value of '1', there are three bits of syndrome 320 that is set to a value of '1' indicating a corresponding parity check equation result in the unsatisfied state. For SWB7, since SB1 is set to a value of '0', SB3 is set to a value of '1', SB6 is set to a value of '0', and SB7 is set to a value of '1', there are two bits of syndrome 320 that are set to a value of '1' indicating corresponding parity check equation results in the unsatisfied state. In another embodiment, the processing logic determines the energy for each bit of the sense word. Depending on the embodiment, the energy of a given bit can represent a number of unsatisfied parity check equations associated with the bit or the number of unsatisfied parity check equations plus the XOR of the current bit value with its original value.

At operation 420, the processing logic determines a maximum number of parity check equation results that are in the unsatisfied state for any one bit of the sense word. Since SWB0 had four unsatisfied parity check equations, SWB1 had three unsatisfied parity check equation, and SWB7 had two unsatisfied parity check equations, parity check component 113 can determine that the maximum number is four unsatisfied parity check equations in the current iteration. Note that all of the bits of the sense word 310 would be considered, but are omitted here for brevity. Parity check component 113 can store (e.g., in local memory 119 or elsewhere in memory sub-system 110) an indication of this maximum number for use in subsequent iterations. In another embodiment, the processing logic determines the maximum energy for any one bit of the sense word.

At operation 425, the processing logic determines whether a current iteration of the LDPC correction process is the first iteration. If the current iteration is the first iteration, at operation 430, the processing logic flips any bits in the sense word having a number of parity check equation results that are in the unsatisfied state (or an energy level) that satisfies an energy threshold condition, and flips each of the parity check equation results associated with those bits. In one embodiment, the energy threshold condition is satisfied when the energy level is greater than or equal to a threshold level of energy. In one embodiment, the threshold level of energy is equal to the maximum number of parity check equation results that are in the unsatisfied state for any one bit of the sense word, as determined at operation 425, but scaled to account for the differences in the number of parity check equations associated with each bit. In one embodiment, the energy (i.e., the number of unsatisfied parity check equations associated with the bit) can be calculated as a percentage or fraction of a total number of parity check equations associated with the bit, and the highest percentage or fraction associated with any one bit can be used as the bit flipping criterion. Additional detail of the scaling operations is provided below. Upon flipping the bits at operation 430, the processing logic returns to operation 405 and determines whether the updated syndrome satisfies the codeword criterion.

If, however, the processing logic determines at operation 425 that the current iteration is not the first iteration, at operation 435, the processing logic scales the number of unsatisfied parity checks associated with each bit of the sense word 310. Using the example above, parity check component 113 can determine a respective energy level associated with each bit of the sense word and a respective number of parity check equations associated with each bit of the sense word. Parity check component 113 can further determine a respective value representing a relationship between the respective energy level and the respective number of parity check equations associated with each bit of the sense word. For example, the respective value can include a percentage or fraction representing the number of unsatisfied parity check equations relative to the total number of associated parity check equations for each bit of the sense word. This percentage or fraction can be referred to as the percentage weight. The full results are presented below in table 1. Parity check component 113 can further clip any bits in the sense word having a respective value that satisfies the scaled bit flip threshold. In one embodiment, parity check component 113 uses the maximum percentage weight from a previous iteration as the scaled threshold and can flip any bits in the corrected word having percentage weight that is greater than or equal to the scaled threshold. For example, if the maximum percentage weight from the previous iteration was 1.0, for SWB6, parity check component 113 can recalculate the percentage weights for each bit of the corrected word, compare those percentage weights to the maximum percentage weight (i.e., the scaled bit flipping threshold) and then flip those bits for which the percentage weight is 1.0. In other embodiments, rather than using a percentage or fraction, parity check component 113 can apply a scaling factor to the energy levels of each bit based on the respective column weights so as to normalize the energy levels while retaining them at integer values, which may be more efficiently processed in certain implementations.

TABLE 1

| Sense Word Bit | Column weight | Energy | Percentage Weight |
|---|---|---|---|
| SWB0 | 8 | 4 | 0.5 |
| SWB1 | 6 | 3 | 0.5 |
| SWB2 | 4 | 1 | 0.25 |
| SWB3 | 4 | 3 | 0.75 |
| SWB4 | 2 | 0 | 0.0 |
| SWB5 | 4 | 2 | 0.5 |
| SWB6 | 4 | 4 | 1.0 |
| SWB7 | 4 | 2 | 0.5 |

At operation 440, the processing logic determines whether a number of iterations performed in the iterative LDPC correction process satisfies an iteration criterion (e.g., is less than a threshold number of iterations). In one embodiment, parity check component 113 maintains a counter which is incremented after each iteration is performed. Parity check component 113 can compare the value of the counter to a threshold value (e.g., 30) to determine if the iteration criterion is satisfied. If the number of iterations does satisfy the iteration criterion, the processing logic continues the LDPC correction process by determining whether the updated syndrome satisfies the codeword criterion and moving on to a next iteration. If, however, the number of iterations performed does not satisfy the iteration criterion (e.g., the number of iterations meets or exceeds the threshold number of iterations), parity check component 113 can determine, at operation 445, that the corrected word cannot be fully corrected and end the LDPC correction process.

Figure 5:
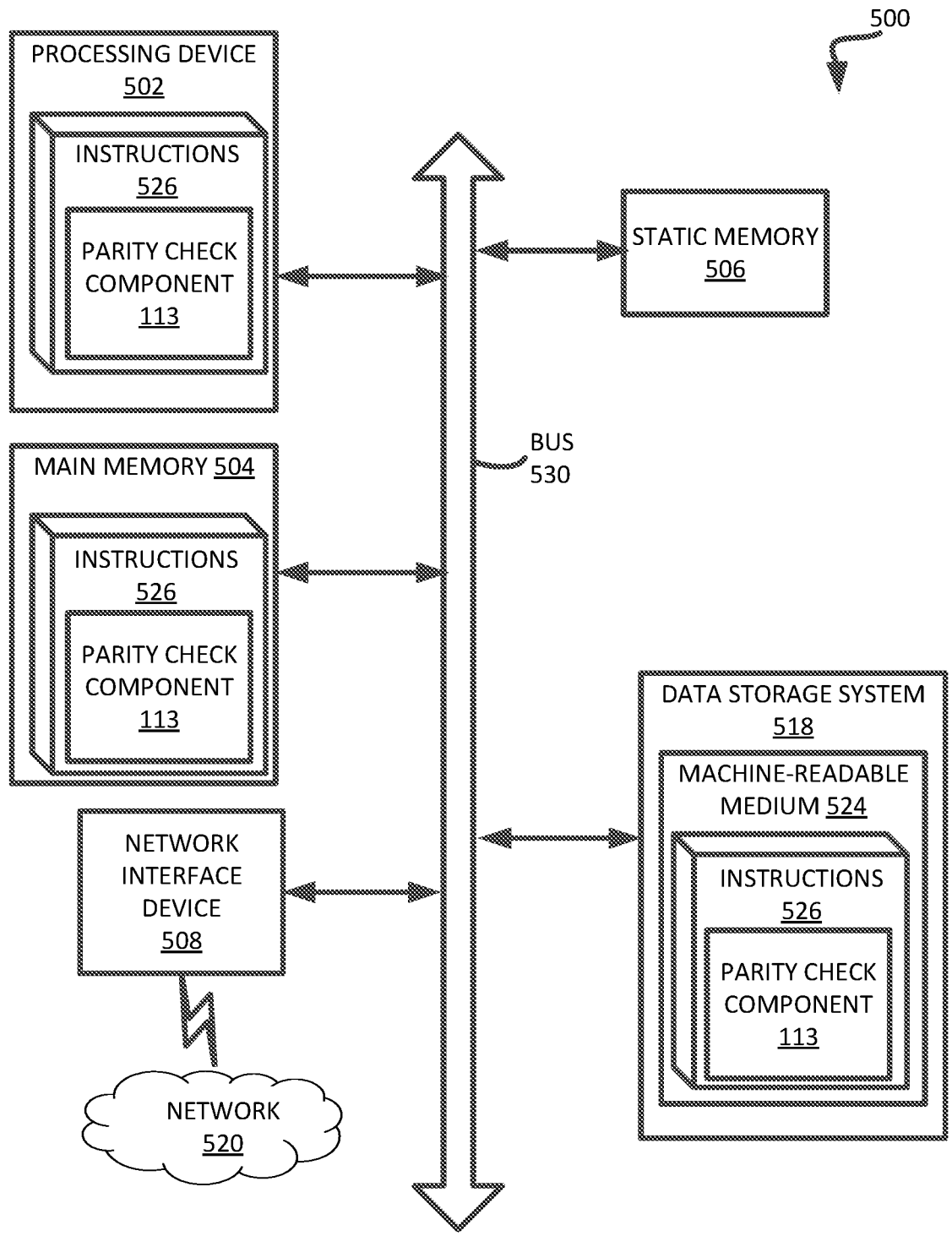
FIG. 5 is a block diagram of an example computer system in which embodiments of the present disclosure may operate.

FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1A) that includes, is coupled to, or utilizes a memory sub-system (e.g., the memory sub-system 110 of FIG. 1A) or can be used to perform the operations of a controller (e.g., to execute an operating system to perform operations corresponding to the parity check component 113 of FIG. 1A). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage system 518, which communicate with each other via a bus 530.

Processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory sub-system 110 of FIG. 1A.

In one embodiment, the instructions 526 include instructions to implement functionality corresponding to the parity check component 113 of FIG. 1A). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
a memory device; and
a processing device, operatively coupled with the memory device, to perform operations comprising:
reading a sense word from the memory device;
executing a plurality of parity check equations on corresponding subsets of the sense word to determine a plurality of parity check equation results;
determining a syndrome for the sense word using the plurality of parity check equation results;
determining whether the syndrome for the sense word satisfies a codeword criterion; and
responsive to the syndrome for the sense word not satisfying the codeword criterion, determining a scaled bit flip threshold and performing an iterative low density parity check (LDPC) correction process using the scaled bit flip threshold to correct one or more errors in the sense word, wherein the scaled bit flip threshold is based on a relationship between a respective number of parity check equation results that are in an unsatisfied state and a respective total number of parity check equations associated with each bit of the sense word from a previous iteration of the iterative LDPC correction process.

2. The system of claim 1, wherein the processing device is to perform operations further comprising:
receiving, from a requestor, a request to read data from the memory device, wherein the sense word is associated with the data; and
responsive to the syndrome for the sense word satisfying the codeword criterion, returning the sense word to the requestor as the requested data.

3. The system of claim 1, wherein each of the plurality of parity check equations corresponds to a different subset of the sense word, and wherein each of the plurality of parity check equation results indicates whether a number of bits set to a value of '1' in a corresponding subset of the sense word is even or odd.

4. The system of claim 1, wherein determining the syndrome for the sense word comprises logically combining the plurality of parity check equation results, and wherein determining whether the syndrome for the sense word satisfies the codeword criterion comprises determining whether all the plurality of parity check equation results in the syndrome are in a satisfied state.

5. The system of claim 1, wherein performing the iterative LDPC correction process comprises:
determining a respective energy level associated with each bit of the sense word;
determining a respective number of parity check equations associated with each bit of the sense word;

determining a respective value representing a relationship between the respective energy level and the respective number of parity check equations associated with each bit of the sense word; and flipping any bits in the sense word having a respective value that satisfies the scaled bit flip threshold.

6. The system of claim 5, wherein the scaled bit flip threshold comprises a maximum value representing the relationship between the respective energy level and the respective number of parity check equations associated with one bit of the sense word from the previous iteration of the iterative LDPC correction process.

7. The system of claim 5, wherein the respective energy levels associated with each bit of the sense word comprises the respective number of parity check equation results that are in the unsatisfied state for each bit.

8. The system of claim 1, wherein the processing device is to perform operations further comprising:
determining whether a number of iterations performed in the iterative LDPC correction process satisfies an iteration criterion;
in response to the number of iterations performed satisfying the iteration criterion, continuing the LDPC correction process; and
in response to the number of iterations performed not satisfying the iteration criterion, ending the LDPC correction process.

9. A method comprising:
reading a sense word from a memory device;
executing a plurality of parity check equations on corresponding subsets of the sense word to determine a plurality of parity check equation results;
determining a syndrome for the sense word using the plurality of parity check equation results;
determining whether the syndrome for the sense word satisfies a codeword criterion; and
responsive to the syndrome for the sense word not satisfying the codeword criterion, determining a scaled bit flip threshold and performing an iterative low density parity check (LDPC) correction process using the scaled bit flip threshold to correct one or more errors in the sense word, wherein the scaled bit flip threshold is based on a relationship between a respective number of parity check equation results that are in an unsatisfied state and a respective total number of parity check equations associated with each bit of the sense word from a previous iteration of the iterative LDPC correction process.

10. The method of claim 9, further comprising:
receiving, from a requestor, a request to read data from the memory device, wherein the sense word is associated with the data; and
responsive to the syndrome for the sense word satisfying the codeword criterion, returning the sense word to the requestor as the requested data.

11. The method of claim 9, wherein each of the plurality of parity check equations corresponds to a different subset of the sense word, and wherein each of the plurality of parity check equation results indicates whether a number of bits set to a value of '1' in a corresponding subset of the sense word is even or odd.

12. The method of claim 9, wherein determining the syndrome for the sense word comprises logically combining the plurality of parity check equation results, and wherein determining whether the syndrome for the sense word satisfies the codeword criterion comprises determining whether all the plurality of parity check equation results in the syndrome are in a satisfied state.

13. The method of claim 9, wherein performing the iterative LDPC correction process comprises:
determining a respective energy level associated with each bit of the sense word;
determining a respective number of parity check equations associated with each bit of the sense word;
determining a respective value representing a relationship between the respective energy level and the respective number of parity check equations associated with each bit of the sense word; and
flipping any bits in the sense word having a respective value that satisfies the scaled bit flip threshold.

14. The method of claim 13, wherein the scaled bit flip threshold comprises a maximum value representing the relationship between the respective energy level and the respective number of parity check equations associated with one bit of the sense word from the previous iteration of the iterative LDPC correction process.

15. The method of claim 13, wherein the respective energy levels associated with each bit of the sense word comprises the respective number of parity check equation results that are in the unsatisfied state for each bit.

16. The method of claim 9, further comprising:
determining whether a number of iterations performed in the iterative LDPC correction process satisfies an iteration criterion;
in response to the number of iterations performed satisfying the iteration criterion, continuing the LDPC correction process; and
in response to the number of iterations performed not satisfying the iteration criterion, ending the LDPC correction process.

17. A non-transitory computer-readable storage medium comprising instructions that, when executed by a processing device, cause the processing device to perform operations comprising:
reading a sense word from a memory device;
executing a plurality of parity check equations on corresponding subsets of the sense word to determine a plurality of parity check equation results;
determining whether the plurality of parity check equation results indicates an error in the sense word; and
responsive to the parity check equation results indicating an error in the sense word, determining a scaled bit flip threshold and performing an iterative low density parity check (LDPC) correction process using the scaled bit flip threshold to correct the error in the sense word, wherein the scaled bit flip threshold is based on a relationship between a respective number of parity check equation results that are in an unsatisfied state and a respective total number of parity check equations associated with each bit of the sense word from a previous iteration of the iterative LDPC correction process.

18. The non-transitory computer-readable storage medium of claim 17, wherein performing the iterative LDPC correction process comprises:
determining a respective energy level associated with each bit of the sense word;
determining a respective number of parity check equations associated with each bit of the sense word;
determining a respective value representing a relationship between the respective energy level and the respective number of parity check equations associated with each bit of the sense word; and flipping any bits in the sense word having a respective value that satisfies the scaled bit flip threshold.

19. The non-transitory computer-readable storage medium of claim 18, wherein the scaled bit flip threshold comprises a maximum value representing the relationship between the respective energy level and the respective number of parity check equations associated with one bit of the sense word from the previous iteration of the iterative LDPC correction process.

20. The non-transitory computer-readable storage medium of claim 18, wherein the respective energy levels associated with each bit of the sense word comprises the respective number of parity check equation results that are in the unsatisfied state for each bit.

* * * * *